US008957400B2

United States Patent

Perniola et al.

(12) United States Patent
(10) Patent No.: US 8,957,400 B2
(45) Date of Patent: Feb. 17, 2015

(54) PHASE-CHANGE MEMORY CELL

(71) Applicants: Commissariat a l'Energie Atomique et aux Energies Alternatives, Paris (FR); Institut Polytechnique de Grenoble, Grenoble (FR)

(72) Inventors: Luca Perniola, Noyarey (FR); Giovanni Betti Beneventi, Polinago (IT)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/740,774

(22) Filed: Jan. 14, 2013

(65) Prior Publication Data

US 2013/0181182 A1 Jul. 18, 2013

(30) Foreign Application Priority Data

Jan. 12, 2012 (FR) ..................................... 12 00094

(51) Int. Cl.

*H01L 47/00* (2006.01)
*H01L 45/00* (2006.01)
*G11C 13/00* (2006.01)
*H01L 27/24* (2006.01)

(52) U.S. Cl.

CPC ............ *H01L 45/06* (2013.01); *G11C 13/0004* (2013.01); *G11C 13/003* (2013.01); *H01L 45/144* (2013.01); *H01L 45/148* (2013.01); *H01L 45/165* (2013.01); *H01L 27/2463* (2013.01); *H01L 45/1233* (2013.01); *H01L 45/126* (2013.01); *H01L 27/2409* (2013.01); *G11C 2013/008* (2013.01); *G11C 2213/72* (2013.01); *G11C 2213/73* (2013.01)

USPC ...... 257/4; 257/2; 257/E47.001; 257/E47.005

(58) Field of Classification Search

USPC ........................... 257/4, 2, E47.001, E47.005

See application file for complete search history.

(56) References Cited

U.S. PATENT DOCUMENTS

2011/0155984 A1 6/2011 Redaelli et al.

FOREIGN PATENT DOCUMENTS

EP 1 816 682 A2 8/2007

OTHER PUBLICATIONS

Reinhard et al., "Properties of chalcogenide glass-silicon heterojunctions," *Applied Physics Letters*, 1973, pp. 186-188, vol. 23, No. 4.
Schroeder, *Semiconductor Material and Device Characterization*, 3rd Edition, John Wiley & Sons, Inc., 2006, pp. 38-41 & 61-63.
Cahill et al., "Nanoscale thermal transport," *Journal of Applied Physics*, 2003, pp. 793-818, vol. 93, No. 2.

*Primary Examiner* — Amar Movva
(74) *Attorney, Agent, or Firm* — Oliff PLC

(57) ABSTRACT

The memory cell includes a memory area which is formed in a phase-change material pattern based on chalcogenide. An electric p/n-type junction is series-connected between electrodes. The p/n junction is formed in a crystalline area by the interface between first and second doped areas of the phase-change material pattern. The memory area is formed in one of the two doped areas, at a distance from the junction.

6 Claims, 2 Drawing Sheets

PHASE-CHANGE MEMORY CELL

BACKGROUND

The present disclosure relates to a memory cell comprising a memory area formed in a phase-change material pattern based on chalcogenide and an electric p/n type junction, series-connected between electrodes.

DISCUSSION OF THE RELATED ART

Phase-change memories comprise a phase-change material, typically a chalcogenide, for example, a chalcogenide of formula $Ge_2Sb_2Te_5$, which is arranged between two electrodes. Such a phase-change material can reversibly switch between a resistive amorphous state and a conductive crystalline state, The two states have different electric properties which enable to define a high state and a low state of the memory cell.

Conventionally, as illustrated in FIG. 1, phase-change memory cell 1 comprises a pattern 2 made of a phase-change material, which forms memory area 3 of cell 1. Memory area 3 is series-connected with a p/n-type diode 4, that is, series-connected with a semiconductor p/n type junction 5, between two electrodes 6. Memory cell 1 is conventionally formed on a silicon substrate. Diode 4 is formed by means of two silicon films 4_a_ and 4_b_, which are respectively n-type and p-type doped. The use of diode 4 enables to avoid errors on reading of the data contained in the memory cells by pre-venting any reading from a parasitic current originating from adjacent cells.

Patent application U.S. 2011/155984 A1 describes such a memory chip with a semiconductor p/n-type junction, formed at the interface between two doped materials, one of them being a phase-change material.

However, the embodiment of FIG. 1 is complex and bulky since a first specific photolithographic level is necessary to form the p/n-type diode and another specific photolithographic level is necessary to form and delimit the phase-change area. The second photolithographic level has to be positioned with respect to the p/n-type diode and thus with respect to the prior photolithographic level. The continuous decrease of memory cell dimensions thus appears to increase the lithographic constraints of this type of memory architectures, since the dimensions must be decreased while keeping sufficient security margins.

OBJECT OF THE INVENTION

The present invention aims at a phase-change memory cell which is easy to implement, compact, and has an improved implementation to ease its integration at all integrated circuit forming stages.

This object tends to be achieved by means of a memory cell which comprises:

- a first pattern made of a first phase-change material of a first conductivity type, the first pattern having a first thermal resistance value,
- a second pattern made of a second phase-change material of a second conductivity type, the second pattern having a second thermal resistance value, the first and second patterns being arranged to form an electric p/n-type junction between two electrodes,
- a heating element connected to the first pattern, the heating element being separated from the second pattern by a first pattern, the heating element having a third thermal resistance value,

- characterized in that the ratio of the thermal resistance of the heating element to the sum of the thermal resistances of the first pattern and of the second pattern ranges between 0.9 and 1.1 and in that a phase-change memory area is formed in contact with the heating element in a portion of the first pattern.

The present invention also aims at a method for sizing such a memory cell to control the junction temperature in the reset phase.

This object tends to be achieved by means of a method which comprises:

- defining a first relation between the dimensions of the first pattern, of the second pattern, and of the heating element to have a ratio of the thermal resistance of the heating element to the sum of the thermal resistances of the first pattern and of the second pattern along the first axis ranging between 0.9 and 1.1,
- defining a second relation between the dimensions of the first pattern, the current flowing through the memory cell, the junction temperature, and the temperature of the interface between the heating element and the first pattern according to the electrothermal equivalence principle,
- defining a third relation between the dimensions of the first pattern, of the second pattern, of the heating element, the current flowing through the memory cell, the temperature across the memory cell, and the temperature of the interface between the heating element and the first pattern according to the electrothermal equivalence principle,
- expressing the junction temperature according to the temperature across the memory cell, to the current flowing across the heating element, to the dimensions of the first pattern, of the second pattern, and of the heating element based on the first, second, and third relations.

BRIEF DESCRIPTION OF THE DRAWINGS

The foregoing and other features and advantages of the present invention will be discussed in detail in the following non-limiting description of specific embodiments in connection with accompanying drawings.

DESCRIPTION OF A PREFERRED EMBODIMENT OF THE INVENTION

Figure 1:
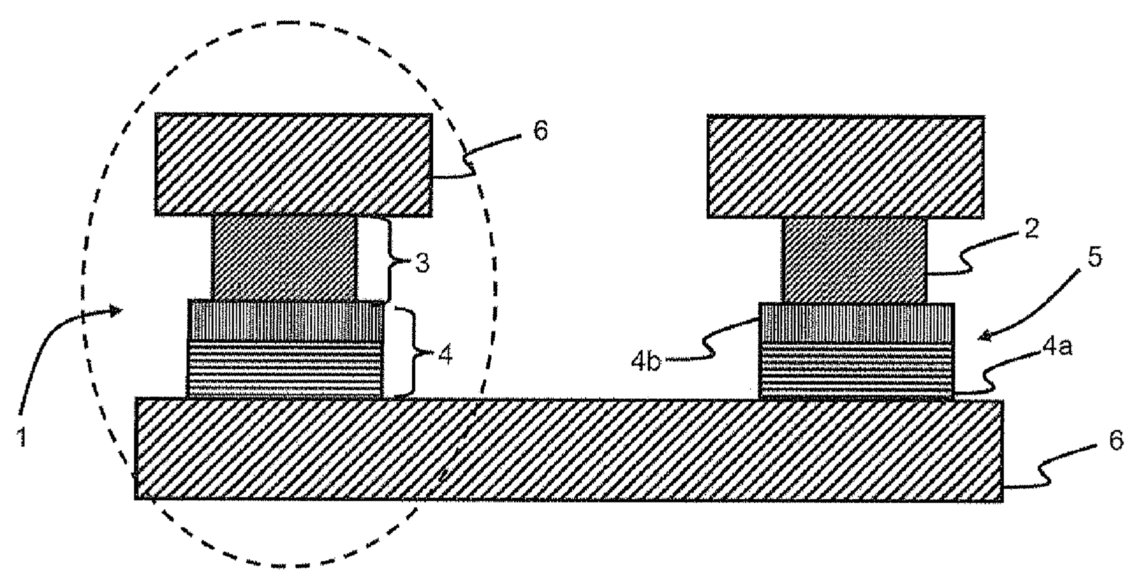
FIG. 1 schematically shows in cross-section view a memory according to prior art, FIG. 2 schematically shows in cross-section view a first embodiment of a memory cell, FIG. 3 schematically shows in cross-section view a second embodiment of a memory cell, FIG. 4 schematically shows in cross-section view a memory cell being manufactured on a substrate.
Figure 2:
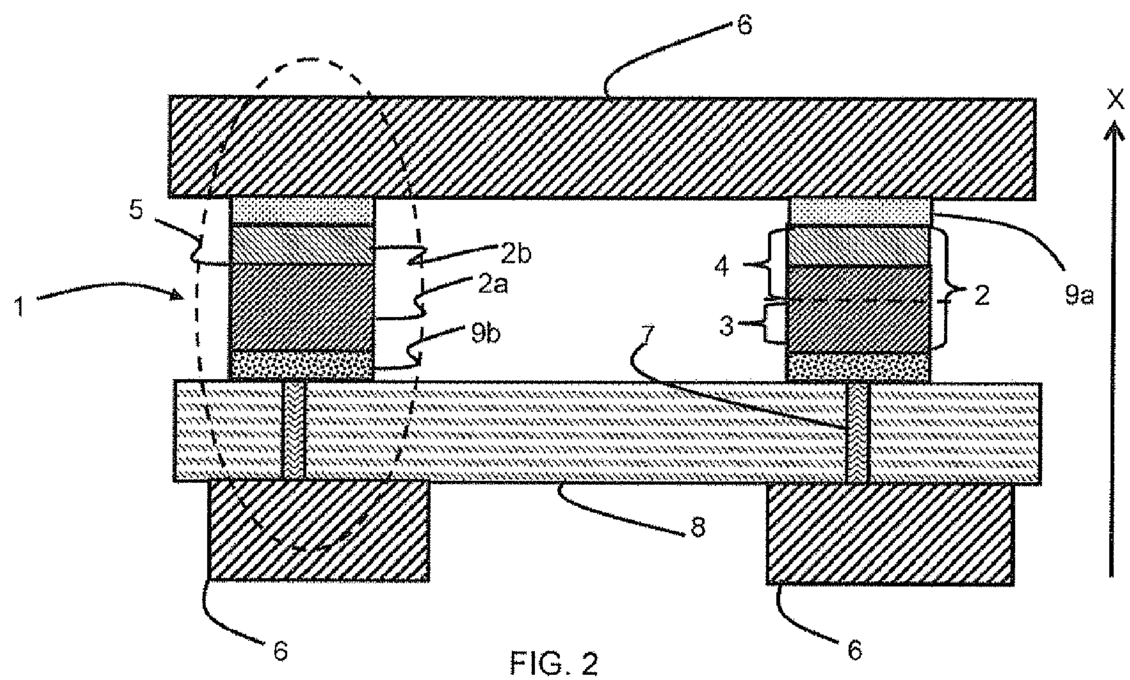
Figure 3:
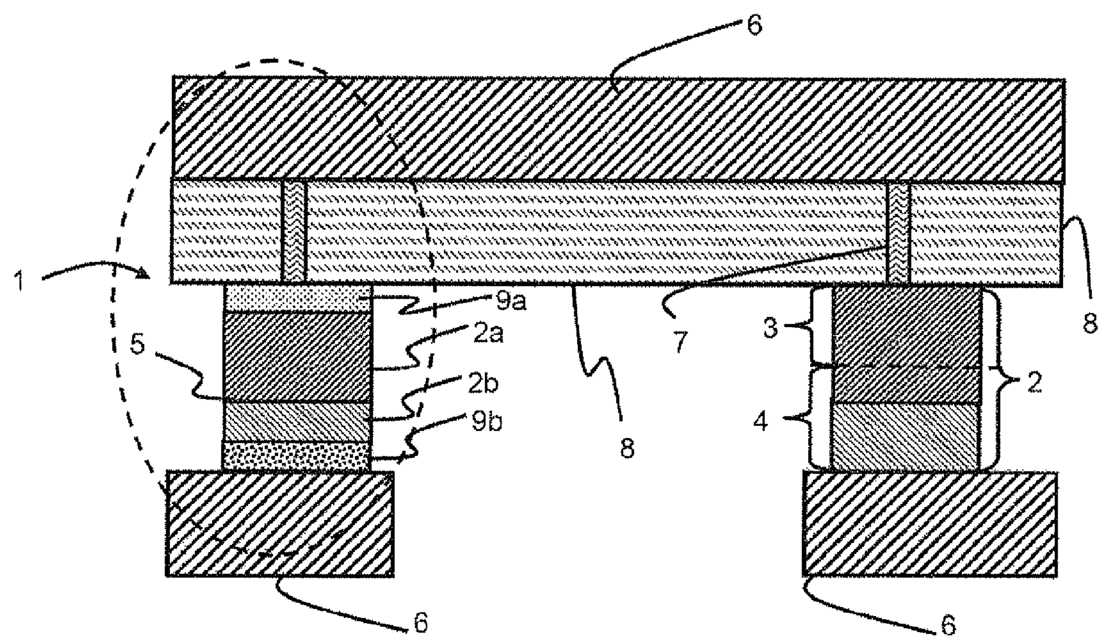

As illustrated in FIGS. 2 and 3, phase-change memory cell 1 comprises a memory area 3 and a diode 4 provided with a p/n-type junction 5 arranged between two electrodes 6. Memory area 3 is series-connected with p/n-type electric junction 5 between the two electrodes 6.

The memory cell also comprises a pattern 2 made of one or several phase-change materials which is coupled with a heating element 7. Phase-change material pattern 2 and heating element 7 are series-connected between the two electrodes 6.

Pattern 2 of the memory cell is divided in two by junction 5. One side of pattern 2 is of a first conductivity type while the other side of pattern 2 is of the opposite conductivity type.

In other words, pattern 2 may be broken up into two adjacent patterns having their interface defining junction 5.

First pattern 2*a* is made of a first phase-change material of a first conductivity type. First pattern 2*a* forms a first area of diode 4. First pattern 2*a* has a first thermal resistance value. Memory area 3 is formed in first pattern 2*a*.

Second pattern 2*b* is made of a second phase-change material of a second conductivity type. Second pattern 2*b* forms a second area of diode 4. Second pattern 2*b* has a second thermal resistance value. First pattern 2*a* and second pattern 2*b* are arranged to form p/n-type electric junction 5 between the two electrodes 6.

Junction 5 is formed by the connection of two volumes of phase-change material which are and remain polycrystalline during the operation of memory cell 1.

If first pattern 2*a* has a p-type conduction, second pattern 2*b* is of type n and conversely to have the desired electric junction 5. Although the first phase-change material may be identical to the second phase-change material in terms of main components, these two materials should have opposite conductivity types.

The interface between patterns 2*a* and 2*b* defines the position of the junction. Patterns 2*a* and/or 2*b* may have an intrinsic doping depending on the nature of the material used and/or on the deposition method used. The indication following which patterns 2*a* and 2*b* are doped does not imply that a doping step is necessary after the pattern has been formed.

Memory area 3 and diode 4 are both made of a phase-change material, which allows more freedom of integration since the two elements can be formed at low temperature. As an example, the deposition temperature of the phase-change material is lower than the deposition temperature of silicon, which is conventionally used to form diodes.

When a current flows from one of electrodes 6 to the other, it crosses phase-change material pattern 2 by successively crossing first pattern 2*a*, and then second pattern 2*b* or conversely. The current only crosses pattern 2 if the flow direction is compatible with the current direction imposed by diode 4.

Heating element 7 is coupled with first pattern 2*a*, and heating element 7 is separated from second pattern 2*b* by first pattern 2*a*. Heating element 7 has a third thermal resistance value. Heating element 7 is made of an electrically-conductive material, for example, a metal which generates heat when crossed by a current. Heating element 7 for example is tungsten.

Preferably, memory area 3 is formed in pattern 2 as close as possible to heating element 7. Preferably still, heating element 7 has an interface with phase-change material pattern 2. In this case, memory area 3 is arranged in contact with heating element 7. The maximum temperature reached by the memory cell is located at the interface between heating element 7 and pattern 2 or between heating element 7 and pattern 2 if a bonding layer is used.

During phases of reading from, writing into, and resetting of memory cell 1, the charge carrier current transits from a first electrode 6 to a second electrode 6 through, successively, heating element 7, first pattern 2*a*, and second pattern 2*b*. The current may also transit in the reverse direction according to the type of diode 4.

The melting temperature of the material forming memory area 3 for example is on the order of 900 K for many phase-change materials, which defines the minimum intensity of the current required to obtain a resetting of the memory.

In the write phase and the reset phase, the current which flows through memory cell 1 modifies the crystal phase of memory area 3.

During the write phase, the temperature at the interface between heating element 7 and first pattern 2*a* increases until it reaches and/or exceeds the crystallization temperature of the first phase-change material. Thereby, part of the volume of first pattern 2*a* passes from an amorphous state to a polycrystalline state.

In the reset phase, a higher current than previously is applied inside of cell 1 and the temperature of the interface between heating element 7 and first pattern 2*a* increases until it achieves the melting of part of the volume of first pattern 2*a*. The molten volume is then rapidly cooled to set memory area 3 in an amorphous state.

Thereby, phase-change material pattern 2 comprises a memory area 3 having its resistivity reversibly varying between a weakly resistive state and a strongly resistive state, to define "high" and "low" states of memory cell 1. Memory area 3 passes from an amorphous state to a crystalline state according to the applied conditions. Memory area 3 is formed in one of the two doped areas of phase-change material pattern 2. The memory cell comprises for this purpose a circuit for applying a write current, a reset current, and a read current which transit through memory area 3 by means of the two electrodes 6.

Since memory cell 1 is one block, with the integration of diode 4 at closest to memory area 3, it is important to control the temperature around junction 5 to decrease or even suppress the diffusion of dopants through junction 5 during phase changes. Maintaining the junction temperature under a threshold voltage enables to decrease the dopant diffusion, which enables to keep, along time, a diode 4 with a good electric performance.

In a preferred embodiment, it is possible to decrease the dimensions of memory cell 1 by forming first pattern 2*a* in a phase-change material which requires a lower transformation temperature than the material forming second pattern 2*b*, which enables to limit the diffusion into junction 5, thus resulting in limiting the diffusion into the diode.

Since pattern 2 is coated with an electrically and thermally insulating material, the heat dissipation is mainly performed through heating element 7 and electrodes 6. To limit the heat dissipation in memory area 3 of the memory cell through electric junction 5, it is preferable to have the lowest possible thermal resistance of heating element 7.

It is also important to have a good efficiency of the heating of the memory area with heating element 7, a reasonable dimension of memory area 3, and a good control of the current flowing through pattern 2 during write and reset phases, which leads to having a heating element with a low surface area of contact with memory area 3.

It has been found that a good heat dissipation in pattern 2 can be obtained when the thermal resistance of heating element 7 is of the same order of magnitude as the sum of the thermal resistances of respective first and second patterns 2*a* and 2*b*. The ratio of the thermal resistance of heating element 7 to the thermal resistance of pattern 2 ranges between 0.9 and 1.1. Such a configuration enables to draw junction 5 away from high-temperature areas, and thus to provide a stable operation along time.

Preferably, the thermal resistance of heating element 7 is equal to the sum of the thermal resistances of respective first and second patterns 2*a* and 2*b*, that is, equal to the thermal resistance of pattern 2. In such a configuration, the maximum temperature in the memory cell is located at the interface between heating element 7 and first pattern 2*a*, which enables to heat a portion of first pattern 2*a* which is used as memory area 3 without excessively heating the rest of pattern 2 forming diode 4.

To have the desired thermal resistance adequacy, it is possible to modulate the involved materials and/or to modulate the geometric dimensions of the different patterns to tend towards a compact and reliable memory cell.

Advantageously, the contact surface area between heating element 7 and pattern 2 corresponds to the surface area of the end of heating element 7 so that heating element 7 has a cross-section smaller than the cross-section of pattern 2 to ease the general memory cell manufacturing method. In such an architecture, the memory area has a hemispherical shape.

Figure 4:
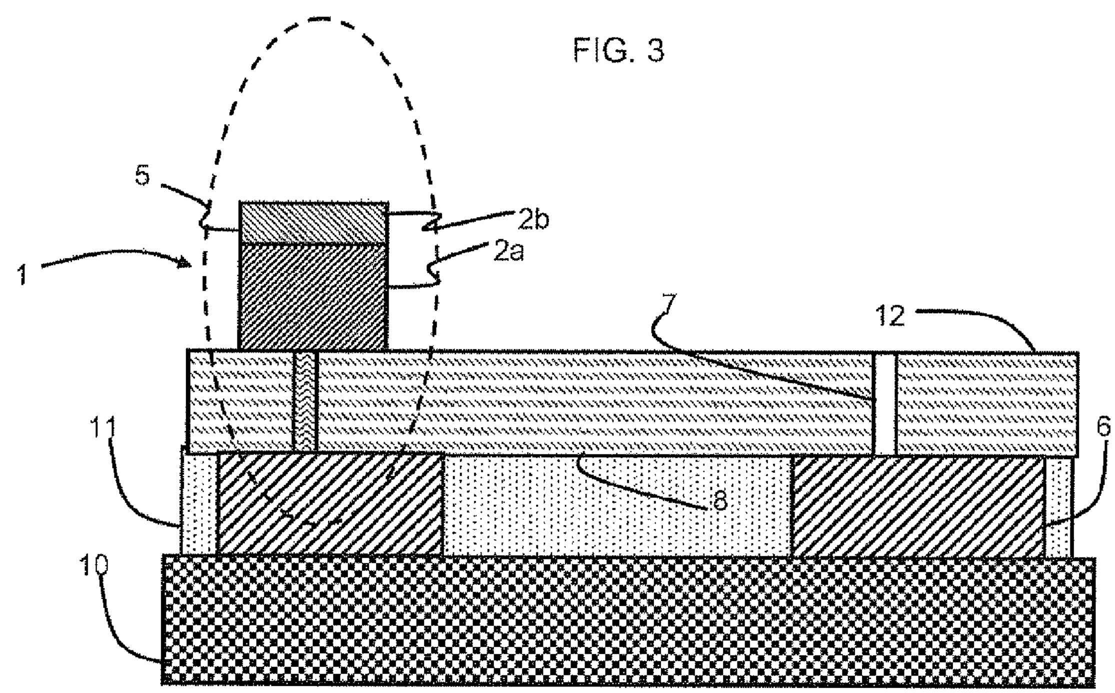

FIG. 4 illustrates a memory cell being formed according to the embodiment of FIG. 2. First electrodes 6 are formed on substrate 10 inside of an electrically-insulating material 11 to form several memory cells (here, two memory cells). A second electrically-insulating film 12 is deposited on an electrode 6 and a hole is formed in the electrically-insulating film to reach electrode 6, as shown in the right-hand portion of FIG. 4. The hole is then filled with an electrically-conductive material to form heating element 7, Then, phase-change material pattern 2 may be deposited on heating element 7, as shown in the left-hand portion of FIG. 4.

The order of the steps may be modified to form pattern 2 on an electrode and then form heating element 7.

To form a heating element 7 which further has a minimum mechanical resistance, the ratio of the height to the width or to the diameter of the heating element does not exceed a maximum threshold value. As an example, for a given technological node, the diameter or the minimum width of heating element 7 are set by the performance of the photolithography step and of the associated etching step. Such technological considerations may define the minimum size of the memory cell. As an example, a ratio of the height to the width or to the diameter which is smaller than or equal to 5 provides good results. The width or the diameter is defined in a direction parallel to the substrate surface while the height is defined perpendicularly to this surface.

In a specific embodiment, one of the two patterns 2*a* and 2*b* of the diode is formed by an additional doping step, for example, by implantation. Preferably, pattern 2 is formed in a single deposition step with a first conductivity type. The differentiation between patterns 2*a* and 2*b* is achieved by doping of a portion of pattern 2 to form diode 4. In this specific embodiment, the total thickness of pattern 2 is selected to enable the forming of diode 4 in pattern 2 by implantation. As an example, a pattern 2 having a thickness greater than or equal to 50 nm enables to form diode 4 by implantation.

To ease the sizing, such a three-dimensional architecture may be simulated in a single dimension if it is considered that the maximum heat received in junction 5 originates from the shortest distance to the contact area between pattern 2 and heating element 7. Thereby, the above-disclosed condition relative to thermal resistances may be turned into a condition relative to the thicknesses of the different elements of this memory cell, considering that the thermal resistance of a material corresponds to its thickness multiplied by its thermal resistivity. It is thus possible to define the thickness of heating element 7, the thickness of pattern 2 and/or of patterns 2*a* and 2*b* according to the technological constraints on the other memory cell elements. Such an equation may be written as follows:

$$0.9 \le \frac{T^{2a} \cdot \rho_{th}^{2a} + T^{2b} \cdot \rho_{th}^{2b}}{T^{7} \cdot \rho_{th}^{7}} \le 1.1,$$

where $T^{2a}$ is the thickness of the first pattern (2*a*)

$T^{2b}$ is the thickness of the second pattern (2*b*)

$\rho_{th}^{2a}$ is the thermal conductivity of the material forming the first pattern (2*a*)

$\rho_{th}^{2b}$ is the thermal conductivity of the material forming the second pattern (2*b*)

$T^{7}$ is the thickness of the heating element (7)

$\rho_{th}^{7}$ is the thermal conductivity of the heating element (7).

By means of a memory cell fulfilling the above-disclosed condition relative to thermal resistances, the temperature at the level of junction 5 is much lower than that of memory area 3, which enables to limit the diffusion of dopants and to avoid risks of transformation of the materials forming diode 4. Such a configuration provides a minimum temperature difference within the diode on the order of 85° C., which improves the memory cell resistance along time.

Phase-change materials are preferably materials based on chalcogenide. However, the phase-change material is any material which may reversibly change phase by means of a current flowing between the two electrodes 6, for example, between a crystalline state and an amorphous state, such as, for example, GeSb. A phase-change material is a material capable of changing phase within a time period compatible with the time required to write into a memory cell, that is, the phase change time is shorter than 100 microseconds. Thereby, the phase-change material cannot be any type of material.

The chalcogenide material for example is of GeSbTe, GeTe, InGeTe, GeTeN, GeTeC, InSbTe type, preferably a material containing Ge and Te or at least containing Te or containing Sb. According to the specifications desired for the memory cell, the preferred materials may vary. For applications where a high operating speed is desired, the phase-change material is advantageously selected from among GeTe, GeSb, and SbTe. If it is desired to operate at high temperatures, the phase-change material is advantageously selected from among GeTe, InGeTe, GeTeN, and GeTeC. If it is desired to operate with a low reset current, the material advantageously is of nitrogen- or carbon-doped GeSbTe type.

According to the forming mode used, the phase-change material is initially considered as being of type n or of type p, although no dopant is added during its forming. The phase-change material is for example formed by chemical vapor deposition or by physical vapor deposition. The observed apparent conductivity type results from the deposition method used. The conductivity type may also result from the addition of a dopant.

First pattern 2*a* and second pattern 2*b* of phase-change materials may be formed by a single layer of phase-change material which has two opposite conductivity types. First pattern 2*a* and second pattern 2*b* may also be formed of different materials. It may also be envisaged to use a plurality of elementary layers of phase-change materials which have different compositions to form the first and/or the second phase-change materials.

In a specific embodiment, a phase-change material is deposited to form first pattern 2*a* and second pattern 2*b*. The phase-change material is deposited with a first conductivity type, after which it is intentionally doped by addition is of doping impurities to form second pattern 2*b* of a second conductivity type opposite to the first type, that is, opposite to that of the doping resulting from the forming of pattern 2. This embodiment is particularly advantageous since it enables to simply form the two phase-change material patterns by decreasing the thermal budget and risks of physico-chemical incompatibility.

Second pattern 2*b* of a second conductivity type may be formed by ion implantation. As an example, the very-low energy, high ionic current, and ultra-high vacuum (UHV) implantation technique may be used. Such an ion implantation results in changing the doping type in second pattern 2*b*. This doping area of a second conductivity type may also be formed by addition of the doping impurity on deposition of the phase-change material.

It may also be envisaged to form phase-change material pattern 2 with at least two different phase-change materials having opposite conductivity types. Thus, the first deposited material is of type p and the second deposited material is of type n or conversely. In this case, no dopant material is intentionally used in the two phase-change materials of pattern 2. As an example, an n-type phase-change material is described by Reinhard et al. ("Properties of chalcogenide glass-silicon heterojunctions", Appl. Phys. Lett., Vol. 23, No. 4, 1973). The other phase-change materials mentioned in the application are considered as p-type doped. First area 2*a* is thus formed of a first phase-change material while second area 2*b* is made of a second phase-change material.

In another alternative embodiment, the p and n doped areas of the phase-change material are both formed by ion implantation in the initial pattern.

It is also important for first and/or second areas 2*a* and 2*b* to be sufficiently thick for the space charge area to withstand the electric field imposed in the portion operating in reverse biasing, which feature especially depends on the built-in voltage, on the dielectric permittivity of the materials used, and on the dopant concentrations.

The memory cell preferably is of pillar type, with first pattern 2*a*, second pattern 2*b*, and heating element 7 arranged above the support substrate, which limits the heat dissipation by conduction in the substrate. In a pillar-type structure, the lateral surfaces of pattern 2 are exposed or are covered with an electrically-insulating material, for example, a silicon oxide or a silicon nitride. Such an architecture imposes the flowing of current in a specific direction between the two electrodes.

The doped phase-change material must have a doping sufficient to have a satisfactory current rectification behavior, typically greater than 1,000. The doping is performed by dopant impurities by a concentration ranging between $10^{14}$ and $10^{17}$ atoms/$cm^3$. The doping of pattern 2 to form the p/n junction may be performed by chemical vapor deposition or by ion implantation. The doping of pattern 2 may be performed, for example, with oxygen, zinc, or gallium atoms.

Phase-change material pattern 2 has two main surfaces, directly or indirectly connected to electrodes 6. The connection between one of electrodes 6 and the phase-change material is achieved by heating element 7.

Heating element 7 is made of an electrically-conductive material which generates heat when it conducts a current. Heating element 7 is in electric contact with the phase-change material and is advantageously compatible therewith from a physicochemical viewpoint. The material forming heating element 7 is selected from among materials having a melting point higher than that of the phase-change material. The material forming heating element 7 is selected to maximize the heating by joule effect in the adjacent phase-change material. Advantageously, heating element 7 enables to heat the greatest possible part of the phase-change material used as memory area 3. Heating element 7 is for example made of TiN, TiSiN, or W. The shape of heating element 7 is selected according to the shape of memory cell 1 (of memory area 3) to maximize the heating by joule effect on flowing of a current through memory cell 1. The shape of heating element 7 is for example elongated in the current flow direction. Heating element 7 may also be formed by a homogeneous layer which forms the interface between electrade 6 and phase-change material pattern 2. Since heating element 7 brings heat to the phase-change material, it should not be arranged close to diode 4 to avoid a migration of dopants due to a too high temperature. Heating element 7 and diode 4 are thus arranged on either side of memory area 3. Thus, heating element 7 provides calories to memory area 3 and not to diode 4. By means of a simulation capable of solving partial derivative equations such as Sentaurus, Comsol Multiphysics, Abacus, or Matlab, it is possible to define the shape of heating element 7, the size of memory area 3, the distance between diode 4 and heating element 7, the current necessary to obtain the phase change, and the materials to be used. Software Sentaurus is advantageously used since it comprises a specific module for phase-change architectures. For a memory cell of surface area $4F^2$ integrated in a 90-nm type semiconductor technology, the cell occupies a surface area of approximately $10^{-2}$ square micrometers along a height on the order of 300 nm, the diode being comprised within the cell.

Electrodes 6, which enable to select memory cell 1, are made of an electrically-conductive material. Electrodes 6 enable to provide the amount of current necessary for the state change in the memory area (writing) and for the reading of its state.

Preferably, electrodes 6 are made of materials of low resistivity, for example, a metallic material or a semiconductor material heavily doped to have an electric behavior resembling that of a metal. More advantageously still, electrodes 6 are formed with a decreased thermal budget (typically below 400° C.), and electrodes 6 are then made of a metallic material, for example, tungsten.

Preferably, in an array of memory cells 1, cells 1 are organized in rows and columns and one of electrodes 6 connects all cells 1 of a same row of the array while the other electrode 6 connects all cells 1 of a same column of the array ("cross-bar" organization).

Preferably, an insulation layer 8 is arranged between phase-change material pattern 2 and one of electrodes 6. Insulation layer 8 separates phase-change material pattern 2 from electrode 6. Heating element 7 crosses insulation layer 8 to electrically connect electrode 6 and phase-change material pattern 2. Insulation layer 8 is made of an insulating material of low thermal conductivity. Insulation layer 8 may be made of a dielectric material, for example, a silicon oxide, a silicon nitride, or a mixture or a stack thereof. In a specific embodiment, material 12 is kept to form insulation layer 8.

Preferably, a passive area 9 may also be arranged between phase-change material pattern 2 and at least one of electrodes 6. Passive area 9 is then formed on the main surface of phase-change material pattern 2, that is, in direct contact with the portion of pattern 2 forming memory area 3 and/or in direct contact with the portion of the pattern forming diode 3. Passive area 9 must have a melting temperature greater than that of the phase-change material. If two passive areas 9 are formed on either side of phase-change material pattern 2, the two areas 9 may be made of the same material or of different materials 9*a*, 9*b*. Since passive areas 9 may be arranged between heating element 7 and memory area 3, they should not prevent the heating by joule effect of memory area 3 from heating element 7. Passive area 9 is made of an electrically-conductive material, for example, Ti, TiN, or TaN. The passive area may also be used to limit or to suppress the diffusion of the phase-change material with electrode 6 or heating element 7. FIG. 3 illustrates two different embodiments of the same memory cell architecture. The left-hand cell comprises passive areas 9*a* and 9*b* while the right-hand cell is deprived thereof. To make the manufacturing process easier, it is preferably to integrate a single type of memory cell in a cell array. Passive area 9 may ease the bonding of pattern 2 to electrode 6 and/or to heating element 7.

The obtaining of a doped chalcogenide material depends on the characteristics of the manufacturing method and not necessarily on the addition of a dopant gas. The characterizing of the obtained material to determine its conductivity type may be performed, for example, by Hall effect measurements, by thermoelectric measurements using the Seebeck effect, by a so-called "rectification" measurement, or by means of optical techniques which use surface "photovoltage". The equivalent dopant concentration may be determined by means of measurements of electric capacitances according to voltage. The operating mode used to determine this characteristic is described in Dieter K. Schroeder's document, Semiconductor Material Device Characterization, Wiley-Interscience; $2^{nd}$ edition (Jun. 17, 1998).

The dopant concentration to be added to form the second doped area is determined according to the results obtained in terms of conductivity type and of equivalent dopant concentration, based on the previous measurements.

The dopant concentration which is added to form the second doped area must be sufficient to allow a good rectification effect of the diode, but it should not promote the forming of an ohmic tunnel junction between the first and second areas.

In addition to being particularly compact, this device is compatible with an integration in the metal interconnection levels since all the technological steps used, and in particular the deposition steps, are possible at temperatures lower than 450° C., or even lower than 400° C. Thereby, the memory cell may be formed in compliance with the constraints defined by the Back-End of Line (BEOL) which governs the integration of integrated circuit interconnection levels.

In a specific embodiment, memory cell 1 is formed above a semiconductor substrate, for example, made of silicon, which comprises one or several active devices. In this specific case, phase-change memory cell is formed above the level comprising the active devices, for example, in an electrically-insulating material. This embodiment imposes a maximum thermal budget not to be exceeded to ensure the operation of the active devices. Diode 4 is formed above the level comprising the active devices, such as transistors, which enables to keep a high compactness while clearing surface area on the substrate.

In a first embodiment, illustrated in FIG. 2, first area 2*a* is formed under second area 2*b*. Passives areas 9*a*, 9*b* are advantageously arranged on the main surfaces of phase-change material pattern 2. A heating element 7 ensures the electric connection between one of electrodes 6 (the lower electrode) and first area 2*a*. Heating element 7 is arranged close to memory area 3 to maximize the heating by joule effect. Heating element 7 crosses insulation layer 8 which is located between lower electrode 6 and passive area 9*b* in contact with first area 2*a*. Upper electrode 6 is in contact with passive area 9*a* associated with second area 2*b*. In this embodiment, first area 2*a* is formed by the non-intentional doping of the phase-change material. Memory area 3 is thus formed in an unintentionally doped area, that is, in the area pattern 2 with the lightest doping.

In a second embodiment, illustrated in FIG. 3, first area 2*a* is formed above second area 2*b*. Passives areas 9*a*, 9*b* are advantageously arranged on the main surfaces of phase-change material pattern 2. A heating element 7 ensures the electric connection between one of electrodes 6 (the upper electrode) and first area 2*a*. Heating element 7 is arranged close to memory area 3 to maximize the heating by joule effect. Heating element 7 crosses insulation layer 8 which is located between upper electrode 6 and passive area 9*a* in contact with first area 2*a*. Upper electrode 6 is in contact with passive area 9*b* associated with second area 2*b*. In this embodiment, first area 2*a* is formed by the unintentional doping of the phase-change material. Memory area 3 is thus formed in an unintentionally doped area, that is, in the area pattern 2 with the lightest doping.

In a third embodiment, not shown, first area 2*a* is formed by intentional doping of the phase-change material. Memory area 3 is thus formed in the intentionally doped area, that is, in the area of pattern 2 with the heaviest doping.

Phase-change material pattern 2 may be formed inside of an electrically-insulating material, for example, air or another gas or another insulating material. Under such conditions, it is necessary to take into account the conduction of heat in this material to define the dimensions of the different memory cell elements. It can also be envisaged to use a structure with an air cavity which may be partial (FIGS. 2 to 4) or complete.

In a specific embodiment, a coverage material is deposited and etched to form a hole. The bottom of the hole directly or indirectly opens out on lower electrode 6. According to the embodiments, heating element 7 may or not be present at the bottom of the hole. The phase-change material is deposited to fill the hole and form phase-change material pattern 2. The phase-change material is doped with a first conductivity type.

A doping step is carried out by means of one of the techniques already mentioned hereabove to obtain the forming of a volume of doped material of the opposite type and thus form junction 5.

Heating element 7 and/or upper electrode 6 are then formed to obtain a memory cell according to one of the embodiments illustrated in FIGS. 2 and 3.

This embodiment has the advantage of using a small number of technological steps and of being integrable with a limited thermal budget.

In an alternative embodiment, a second material is deposited to complete pattern 2 and thus form diode 4 and memory area 3.

In a specific embodiment of the memory cell, due to technological constraints, some dimensions of the memory cell are imposed, for example, the memory cell thickness is defined, but it may also be envisaged for the thickness of the first pattern, of the second pattern, or of heating element 7 to be defined.

To obtain a highly compact memory cell, it is advantageous to define the dimensions of the different memory cell elements according to the desired integration density to integrate junction 5 and memory area 3 as close as possible without jeopardizing the reliability of the memory cell.

Phase-change material pattern 2 and heating element 7 are sized to have thermal resistances which are equal or of the same order of magnitude along axis X, which enables to do away with the memory section, to consider the memory cell as a one-dimensional device. Axis X substantially represents the current flow direction in the cell between electrodes 6.

Thus, by placing pattern 2 in contact with heating element 7, memory area 3 is arranged in contact with heating element 7 and its surface area within pattern 2 is controlled.

In the specific case where one of the two doped areas of diode 4 is formed by doping, the minimum thickness of pattern 2 is imposed by technological constraints, for example, associated with the implantation conditions or with the diffusion of dopants inside of pattern 2.

If the dimensions of heating element 7 are also defined by technological constraints associated with the manufacturing method and/or with the structure compactness, the dimensions of heating element 7 and of pattern 2 are defined.

In such a structure, it is then possible to know the temperature at the level of junction 5 according to the temperature present across the cell and to the value of the applied current, which enables to refine the sizing of the structure.

According to the thermal equivalence principle, the temperature difference between memory area 3 and junction 5 can be expressed according to the current flowing through cell 1 and to the thermal and electric resistances of first pattern 2*a* as follows:

$$T_R - T_J = R_{el}^{2a} \cdot R_{th}^{2a} \cdot I_R \cdot I_R, \text{ where} \quad (1)$$

$T_R$ is the temperature of the interface between heating element 7 and first pattern 2*a* in Kelvins;

$T_J$ is the temperature of junction 5 in Kelvins;

$R_{el}^{2a}$ is the electric resistance of pattern 2*a* in Ohms in the polycrystalline region;

$R_{th}^{2a}$ is the thermal resistance of first pattern 2*a* in Kelvins/Watts;

$I_R$ is the current flowing in memory 1 in Amperes.

This equation enables to relate the dimensions of first pattern 2*a* represented by the electric resistance of first pattern 2*a*, the current flowing in memory cell 1, the temperature of junction 5, and the temperature of the interface between heating element 7 and first pattern 2*a*.

Similarly, the electrothermal equivalence of cell 1 may be written, during the resetting, as:

$$T_R - T_O = R_{ON}^{S} \cdot R_{th}^{H} \cdot I_R \cdot I_R, \text{ where} \quad (2)$$

$T_R$ is the temperature of the interface between heating element 7 and first pattern 2*a* in Kelvins;

$T_O$ is the temperature present across the cell in Kelvins (the ambient cell temperature);

$R_{ON}^{S}$ is the electric resistance of the cell, that is, the sum of the electric resistances of heating element 7, of first pattern 2*a*, and of second pattern 2*b* in Ohms;

$R_{th}^{H}$ is the equivalent thermal resistance of pattern 2 and of heating element 7 assembled in parallel, in Kelvins/Watts;

$I_R$ is the current flowing through the memory in Amperes.

By combining the two above equations, it is then possible to express junction temperature $T_J$ according to the conditions applied to the cell and to its electric and thermal characteristics as follows:

$$T_J = T_0 + R_{ON}^{S} \cdot R_{th}^{H} \cdot I_R \cdot I_R - R_{el}^{2a} \cdot R_{th}^{2a} \cdot I_R \cdot I_R \quad (3)$$

in a specific embodiment which is well adapted to a pillar-type memory cell, reset current $I_R$ is equal to 1.5 times melting current $I_M$, which can be written as $$I_M = \sqrt{\frac{T_M - T_0}{R_{ON}^{S} - R_{th}^{H}}} \quad (4)$$

Thus, by imposing the maximum temperature not to be reached by junction 5 in order to keep an acceptable operation for the expected lifetime, a condition on the thermal and electric resistances of the memory cell is also imposed.

When this technological constraint is associated with the equivalence or quasi-equivalence of the thermal resistance between pattern 2 and heating element 7, this sets the memory cell dimensions and/or the maximum current acceptable by the memory cell. It is then possible to modulate the junction temperature according to the diameter of heating element 7 which is used to define the state of memory area 3.

The electric resistance of the materials used may be measured, for example, by the 4-point technique. The thermal resistance may be measured by means of the three omega technique for example described in D. G. Cahill et al.'s publication, J. Appl. Phys., 93, 793, (2003).

In other words, the sizing method may be summarized as follows:

- defining a first relation between the dimensions of first pattern 2*a*, of second pattern 2*b*, and of heating element 7 to have a ratio of the thermal resistance of heating element 7 to the sum of the thermal resistances of first pattern 2*a* and of second pattern 2*b* along the first axis ranging between 0.9 and 1.1,
- defining a second relation between the dimensions of first pattern 2*a*, the current flowing through memory cell 1, the temperature of junction 5, and the temperature of the interface between heating element 7 and first pattern 2*a* according to the electrothermal equivalence principle,
- defining a third relation between the dimensions of first pattern 2*a*, of second pattern 2*b*, of heating element 7, the current flowing through memory cell 1, the temperature across memory cell 1, and the temperature of the interface between heating element 7 and first pattern 2*a* according to the electrothermal equivalence principle,
- expressing the temperature of junction 5 according to the temperature across memory cell 1, to the current flowing across heating element 7, to the dimensions of first pattern 2*a*, of second pattern 2*b*, and of heating element 7 based on the first, second, and third relations.

Once the dimensions of cell 1 have been imposed according to the various technological constraints, such as for example the maximum temperature authorized by junction 5, the minimum or maximum thickness of first pattern 2*a*, of second pattern 2*b*, or of heating element 7, there only remains to form memory cell 1.

The invention claimed is:

1. A memory cell comprising:

a first pattern made of a first phase-change material of a first conductivity type, the first pattern having a first thermal resistance value, a second pattern made of a second phase-change material of a second conductivity type, the second pattern having a second thermal resistance value, an electric p/n-type junction located between two electrodes, and formed at the interface between the first and second patterns, in an area where both patterns are polycrystalline, a heating element connected to the first pattern, the heating element being separated from the second pattern by the first pattern, the heating element having a third thermal resistance value, the ratio of the third thermal resistance to the sum of the first and second thermal resistances ranging between 0.9 and 1.1, a phase-change memory area formed in contact with the heating element in a portion of the first pattern.

2. Memory cell according to claim 1, wherein the first pattern and the second pattern are made of the same phase-change material.

3. Memory cell according to claim 1, comprising a circuit for applying a first current configured to melt the first phase-change material.

4. Memory cell according to claim 3, comprising a circuit for applying a second current configured to cause the crystallization of the first phase-change material.

5. Memory cell according to claim 1, wherein the first pattern and/or the second pattern are formed by elementary layers of phase-change materials having different compositions.

6. Memory cell according to claim 1, wherein the thicknesses of the heating element, of the first phase-change material pattern, and of the second phase-change material pattern are configured to fulfill the following equation:

$$0.9 \leq \frac{T^{2a} \cdot \rho_{th}^{2a} + T^{2b} \cdot \rho_{th}^{2b}}{T^{7} \cdot \rho_{th}^{7}} \leq 1.1,$$

where:

$T^{2a}$ is the thickness of the first pattern $T^{2b}$ is the thickness of the second pattern $\rho_{th}^{2a}$ th is the thermal conductivity of the material forming the first pattern $\rho_{th}^{2b}$ th is the thermal conductivity of the material forming the second pattern $T^{7}$ is the thickness of the heating element $\rho_{th}^{7\ th}$ is the thermal conductivity of the heating element.

* * * * *